(12) United States Patent
Huisman

(10) Patent No.: US 8,937,820 B2
(45) Date of Patent: Jan. 20, 2015

(54) SWITCHED-MODE POWER SUPPLY APPARATUS AND METHOD

(75) Inventor: Hendrik Huisman, Tilburg (NL)

(73) Assignee: Koninklijke Philips N.V., Eindhoven (NL)

( * ) Notice: Subject to any disclaimer, the term of this patent is extended or adjusted under 35 U.S.C. 154(b) by 227 days.

(21) Appl. No.: 13/814,256

(22) PCT Filed: Aug. 5, 2011

(86) PCT No.: PCT/IB2011/053500
§ 371 (c)(1),
(2), (4) Date: Feb. 5, 2013

(87) PCT Pub. No.: WO2012/020363
PCT Pub. Date: Feb. 16, 2012

(65) Prior Publication Data
US 2013/0127532 A1    May 23, 2013

(30) Foreign Application Priority Data
Aug. 13, 2010 (EP) .................................... 10172725

(51) Int. Cl.
*H03K 7/08* (2006.01)
*H03F 3/217* (2006.01)
(Continued)

(52) U.S. Cl.
CPC ................. *H03F 3/217* (2013.01); *H03K 7/08* (2013.01); *H02M 1/088* (2013.01); *H02M 2001/385* (2013.01); *G01R 33/3852* (2013.01); *H03F 3/2173* (2013.01)
USPC .............................. 363/41; 332/107; 323/283

(58) Field of Classification Search
CPC . H02M 2001/385; H02M 1/088; H02M 7/48; H03K 7/08
USPC .............. 363/41; 332/107, 109–110; 323/282
See application file for complete search history.

(56) References Cited

U.S. PATENT DOCUMENTS

| 5,617,058 A | 4/1997 | Adrian et al. |
| 5,764,024 A * | 6/1998 | Wilson .......................... 318/805 |

(Continued)

FOREIGN PATENT DOCUMENTS

GB    2357915 A    7/2001

OTHER PUBLICATIONS

Holmes, G., et al.; Pulse width modulation for power converters: Principles and practice; 2003; Wiley-IEEE Press. abstract, 2 pages.

(Continued)

*Primary Examiner* — Harry Behm

(57) ABSTRACT

The present invention relates to a switched-mode power supply apparatus and a corresponding method. For an effective compensation of non-linearities caused by dead-time and voltage drops in the switching power amplifier of the apparatus, an apparatus is proposed comprising a switching power amplifier (14) for amplifying a signal supplied by an external signal source (11) and for supplying a load voltage and/or load current to a load (15), and a control unit (12; 12*b*) for controlling the switching of said switching power amplifier based on a timing setting, said control unit being adapted for simulating the behavior of the switching power amplifier by predicting the average load voltage and/or load current for at least two, in particular a plurality of, timing settings for a desired load voltage and/or load current based on state information about the present state of the switching power amplifier.

10 Claims, 14 Drawing Sheets

(51) Int. Cl.
*G01R 33/385* (2006.01)
*H02M 1/088* (2006.01)
*H02M 1/38* (2007.01)

(56) References Cited

U.S. PATENT DOCUMENTS

| | | |
|---|---|---|
| 6,294,954 B1 | 9/2001 | Melanson |
| 6,593,806 B1 | 7/2003 | Melanson |
| 7,151,406 B2 | 12/2006 | Labbe |
| 7,352,220 B2 * | 4/2008 | Heikkila ................. 327/175 |
| 7,541,769 B2 * | 6/2009 | Nawa et al. ............. 318/800 |
| 2002/0128731 A1 | 9/2002 | Wegerich et al. |
| 2006/0208798 A1 | 9/2006 | Labbe |
| 2007/0029959 A1 * | 2/2007 | Ta et al. ................. 318/432 |
| 2007/0152750 A1 | 7/2007 | Andersen et al. |
| 2008/0180166 A1 | 7/2008 | Gustat |
| 2008/0270090 A1 | 10/2008 | Bracker et al. |
| 2008/0312855 A1 | 12/2008 | Monti et al. |
| 2009/0001925 A1 * | 1/2009 | Ohtani et al. ............ 318/805 |

OTHER PUBLICATIONS

Nise, N. S.; Control Systems Engineering; 4th Ed. 2004; John Wiley & Sons, Inc.; Preface, pp. i-xxiii.

* cited by examiner

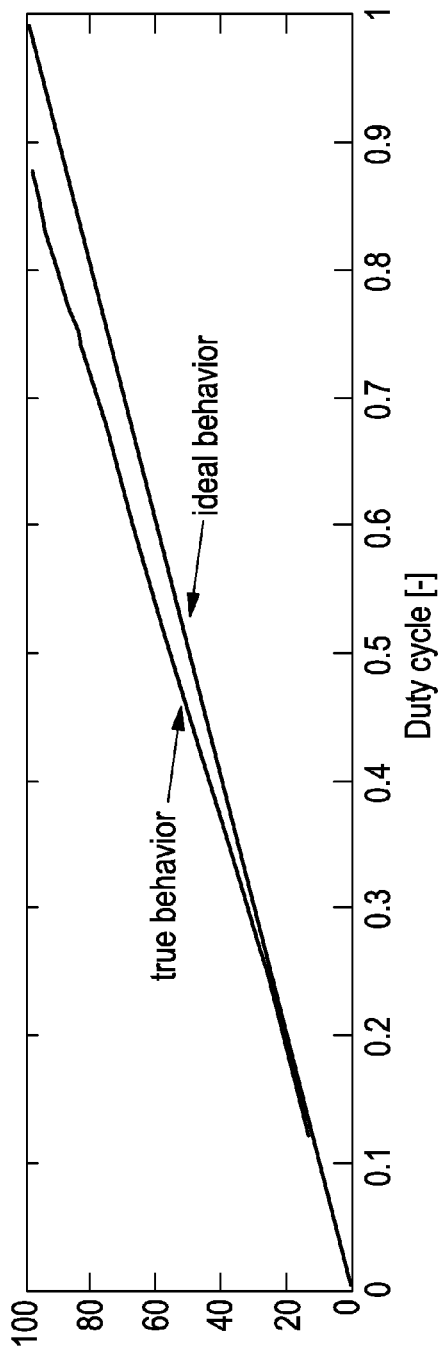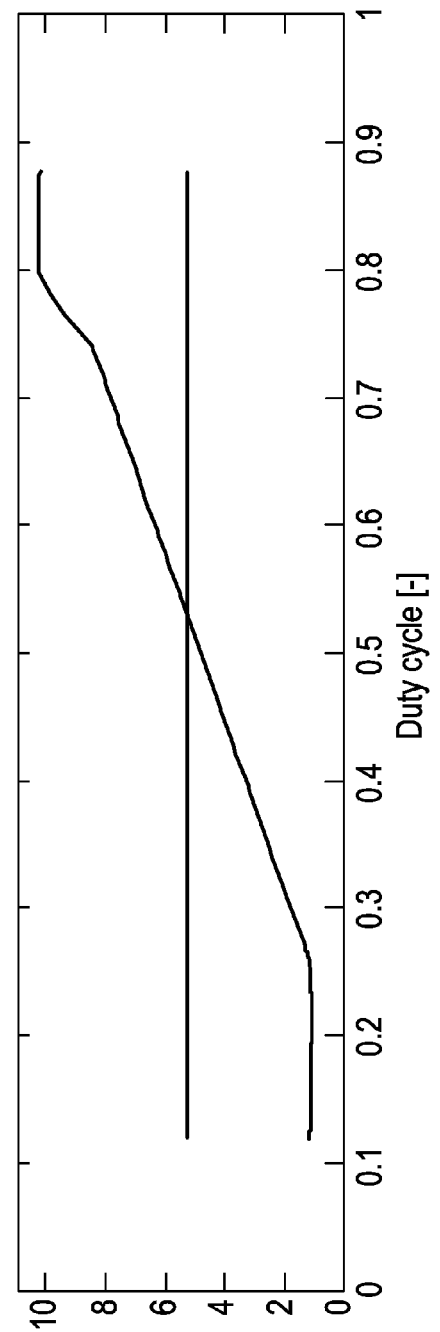
FIG. 9A
FIG. 9B

SWITCHED-MODE POWER SUPPLY APPARATUS AND METHOD

FIELD OF THE INVENTION

The present invention relates to a switched-mode power supply apparatus and a corresponding method. Further, the present invention relates to a device comprising a load to be provided with a load voltage and/or load current.

BACKGROUND OF THE INVENTION

Switching power amplifiers often are afflicted with non-linearities due to the switching behavior of the output stage. The exact nature of these non-linearities not only depends on the type of power semiconductor(s) used, but also on the connected circuit(s) at load and driving side. In precision power applications, such as for example motion control and gradient amplifiers for magnetic resonance imaging (MRI), compensation of these non-linearities is mandatory because a feed-forward path is in most cases used in the control system.

US 2006/208798 A1 discloses a method of operating a class D amplifier output stage that compensates for nonlinearity introduced by a residual load current during the dead time in the switching of the output stage. The amplifier output stage includes an input, a gate driver circuit, two output transistors, an output, and a current sensing circuit. The transistors are serially connected between the terminals of a power supply. A residual load current flows through the transistors when they are switched off. The gate driver circuit increases or decreases the duty cycles of signals driving the transistors based on the direction of the residual load current flowing through the transistors, thereby causing the duty cycle of the amplifier output to remain substantially constant and equal to the duty cycle of the amplifier input.

As shown in US 2006/208798, the accuracy that can be obtained by using (only) the direction of the load current for compensation is limited. To obtain better results, a model-based approach can be used, for example using look-up tables to predict the system behavior over the next time cycle of interest.

A possible method to fill such a look-up table is to repeatedly simulate the circuit off-line for all combinations of the parameters mentioned above and store the resulting average voltage in a look-up table. An appropriate compensation of the switch timings can be found by using look-up table entries and, if needed, use interpolation to find an approximation of the circuit behavior for exactly the combination of circuit states which has been measured by the controller at the beginning of the control time interval. Such a solution is possible in principle, but will, if implemented in full, need considerable memory resources. Even with the abundance of cheap memory devices available today, such an approach is limited in accuracy and the number of state variables which can be used due to the exponential growth laws inherent in such an approach.

SUMMARY OF THE INVENTION

It is an object of the present invention to provide a switched-mode power supply apparatus and a corresponding method, which enable an effective compensation of non-linearities caused by dead-time and voltage drops in the switching power amplifier of the switched-mode power supply apparatus.

In a first aspect of the present invention a switched-mode power supply apparatus is presented comprising:

a switching power amplifier for amplifying a signal supplied by an external signal source and for supplying a load voltage and/or load current to a load, and a control unit for controlling the switching of said switching power amplifier based on a timing setting, said control unit being adapted for simulating the behavior of the switching power amplifier by predicting the average load voltage and/or load current for at least two, in particular a plurality of, timing settings for a desired load voltage and/or load current based on state information about the present state of the switching power amplifier.

In a further aspect of the present invention a device comprising a load to be provided with a load voltage and/or load current is presented, said device comprising:

a load to be provided with a load voltage and/or load current, and a switched-mode power supply apparatus as proposed according to the present invention for supplying a load voltage and/or load current to the load.

Preferred embodiments of the invention are defined in the dependent claims. It shall be understood that the claimed method and the claimed device have similar and/or identical preferred embodiments as the claimed switched-mode power supply apparatus and as defined in the dependent claims.

The invention proposes an alternative approach for reliable compensation of non-linearities caused by dead-time and voltage drops in switching power amplifiers by using in-the-loop simulation on an accelerated time scale. The size of the circuitry (for example based on field-programmable gate arrays, FPGAs) necessary to do this shows linear growth with respect to the complexity of the circuits to represent, due to the parallel processing inherent to such an implementation. Acceleration with a factor 10 appears to be readily possible with present-day devices. For example, such an implementation would allow the prediction of the next 20 microseconds (a typical value for the control and/or switching cycle for the innermost control loop in the systems mentioned above) in 2 microseconds or less.

Addition of extra circuit features of interest (such as device temperatures and/or details of driver circuits) is possible without hampering the speed of simulation as long as the implementation used contains enough hardware resources.

The signal supplied by the external signal source mentioned here may be a power signal provided by a power source, but is generally a set point, which is typically supplied by a "master" controller on an insignificant power level.

In a preferred embodiment said control unit is adapted for selecting the timing settings for controlling the switching of said switching power amplifier from the timing settings used for predicting the average load voltage and/or load current by selecting the timing setting belonging to a predicted average load voltage and/or load current closest to the desired load voltage and/or load current. In this way a high accuracy of the prediction can generally be obtained.

According to another embodiment said control unit is adapted for determining the timing setting for controlling the switching of said switching power amplifier by interpolating between the timing settings belonging to predicted average load voltages and/or load currents closest to the desired load voltage and/or load current. By such an interpolation the optimal timing setting can be obtained.

Preferably, said control unit comprises a sampled control circuit for determining the desired load voltage and/or load current from the state information about the present state of the switching power amplifier and a set point. Said sampled control circuit is particularly adapted for periodically providing the desired output voltage of the amplifier based on a combination of set point and measurement signals.

In still another embodiment said control unit is adapted for predicting the average supply voltage and/or supply current for a predetermined number of timing settings, in particular for a number in the range from 2 to 25 of timing settings. 2 to 25 are reasonable numbers, but other numbers can be implemented in practice as well.

The switched-mode power supply apparatus may further comprise sensing means for sensing said state information about the present state of the switching power amplifier, in particular for sensing internal currents and/or voltages of the switching power amplifier and/or the temperature of one or more elements of the power amplifier and/or the power supply apparatus. Such sensing means are generally implemented by commonly known means, such as current measurement elements, voltage measurement elements, temperature measurement elements, etc. However, for those signals which are difficult to obtain using commonly known means as described above, a prediction method, for example based on the use of a physical model of the circuit and/or device behavior, can also be used. Such an approach is particularly interesting for measurement of the temperature of the semiconductor junctions, which are almost not accessible with commonly known means.

Still further, said control unit may be adapted for predicting the average load voltage and/or load current for the next switching period with high fidelity. This is especially important if the switching power amplifier is used in a feed-forward control chain.

In a practical implementation said control unit is adapted for predicting the average load voltage and/or load current for a subsequent time interval, in particular equal to a control cycle or in the range from 1 to 200, in particular from 5 to 50 μsec.

BRIEF DESCRIPTION OF THE DRAWINGS

These and other aspects of the invention will be apparent from and elucidated with reference to the embodiment(s) described hereinafter. In the following drawings FIG. 9 shows the dependence of average phase leg voltage on duty cycle with a realistic load attached and the difference between true and ideal behavior on a larger scale.

DETAILED DESCRIPTION OF THE INVENTION

Switching power amplifiers often are afflicted with non-linearities due to the switching behavior of the output stage. In precision power applications, such as used for precise motion control and in the gradient system of magnetic resonance imaging (MRI) apparatus, compensation of these non-linearities is mandatory because a feed-forward path is in most cases used in the control system.

Figure 1:
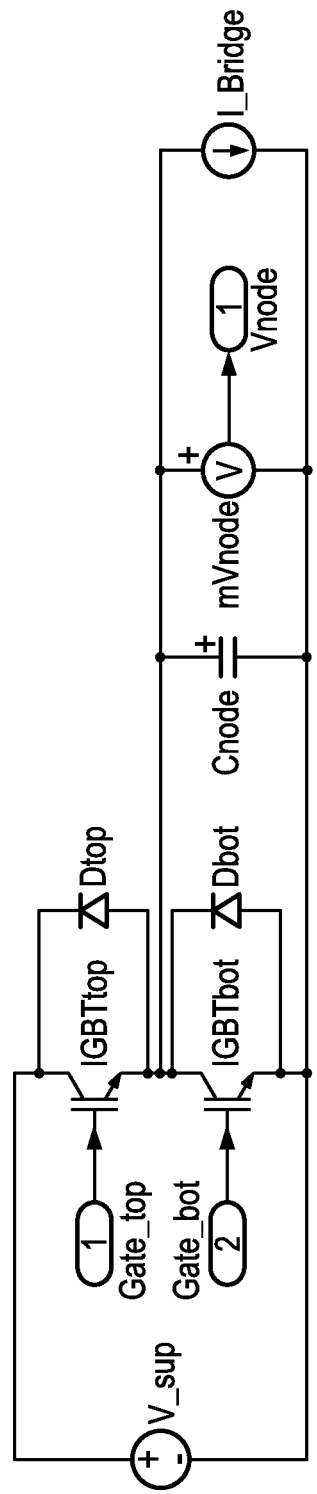
FIG. 1 shows a phase leg with constant current load and switching node capacitance.

The non-linear behavior is mainly caused by the non-zero time it takes to switch off one semiconductor in a phase leg and switch on the other one. Usually, a so-called dead time is introduced between the switching off and on events, to create some tolerance for timing differences between different incarnations of the power semiconductors, the driving stages, and circuit states. During the dead time, both power semiconductors are turned off, and the voltage on the switching node is mainly determined by the output current (while the initial state (voltage) of the switching node is generally relevant as well). For the load of the phase leg, which in general will have an inductive character, the average voltage during a certain time span is important. This average voltage also depends on the switching node voltage during the dead time. To illustrate the relevant phenomena, a phase leg, built up with Insulated Gate Bipolar Transistors (IGBTs) and diodes is shown in FIG. 1.

The phase leg is supplied with a DC voltage V_sup from a voltage source, and loaded with a DC output current I_bridge from a current source. The combined capacitance on the switching node is shown as a single capacitor Cnode. A measurement device mVnode is incorporated to show the definition of the switching node voltage as shown in subsequent figures.

Figure 2:
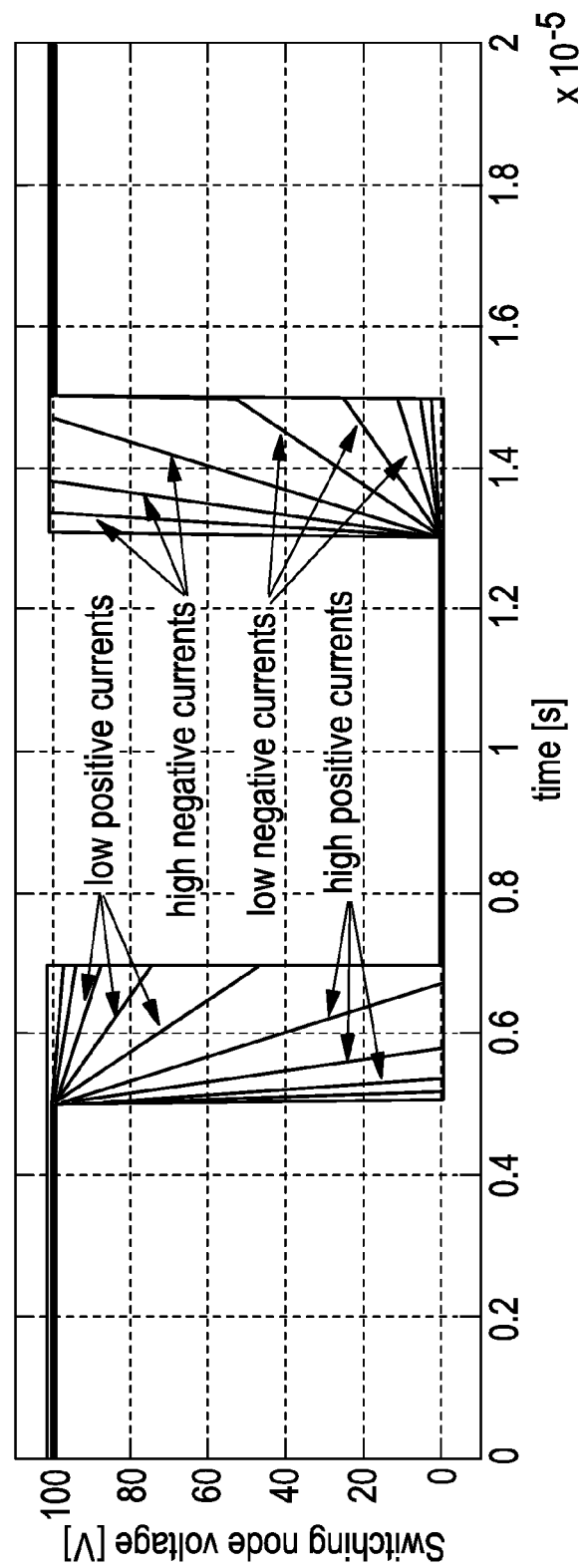
FIG. 2 shows off/on switching of a single phase leg for varying output currents.

Depending on the sign and value of the output current, the voltage on the switching node shows varying behavior. The circuit operation has been simulated using various values for I_bridge, V_sup=100V, a switching cycle of 20 μs, and Cnode=8 nF. The IGBTs are implemented as ideal switches with series resistance 100 mΩ. This is a rather crude model, which is used only to illustrate the main phenomena which cause non-linearities. In reality, the detailed switching behavior of the power semiconductors and the non-linearity of the parasitic device capacitances which are represented by Cnode in FIG. 1 need to be taken into account. The shapes of the node voltage versus time for this example are shown in FIG. 2.

The timing (switching on/off) of the power semiconductors has been set such that a nominal duty cycle of 60% and a dead time of 2 μs are used. The nominal switching points in this example lie at t=6 μs (high to low transition) and t=14 μs (low to high). Due to the dead time, the real switching can take place up to 1 μs, i.e. 50% of the dead time interval, earlier or later, as shown in FIG. 2. As a result, the switching node voltage during the dead time interval, and thereby also the average of this voltage over a switching cycle, depends on the sign and magnitude of the output current. This dependence is shown in FIG. 3.

In this example, the most significant variation of the average voltage (i.e. the swing of almost 20 volts between −2 A and +2 A output current) is caused by the dead time. Additionally, a finite slope can be observed for higher current values. This slope is mainly caused by the voltage drop due to the resistive behavior of the power semiconductors, while the influence of the voltage commutation is also present, but above a few amperes in this example much smaller than the resistive voltage drop.

Figure 3:
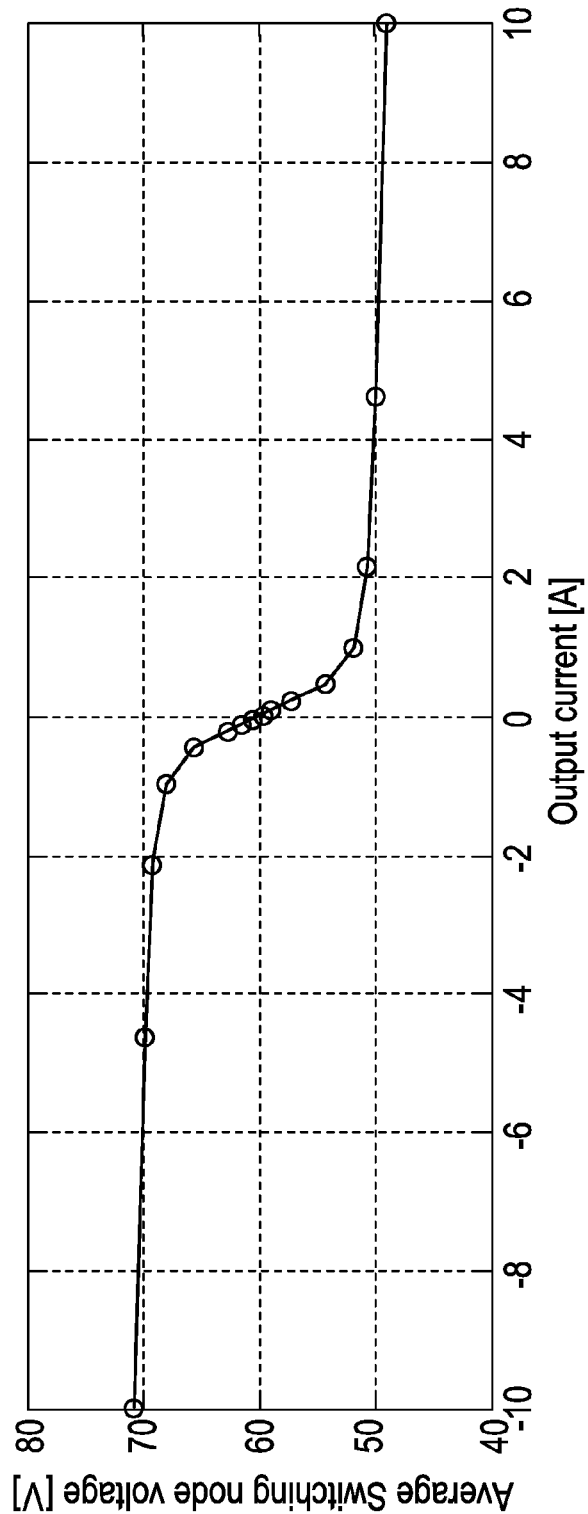
FIG. 3 shows the mean value of phase leg voltage for varying output currents.
Figure 4A:
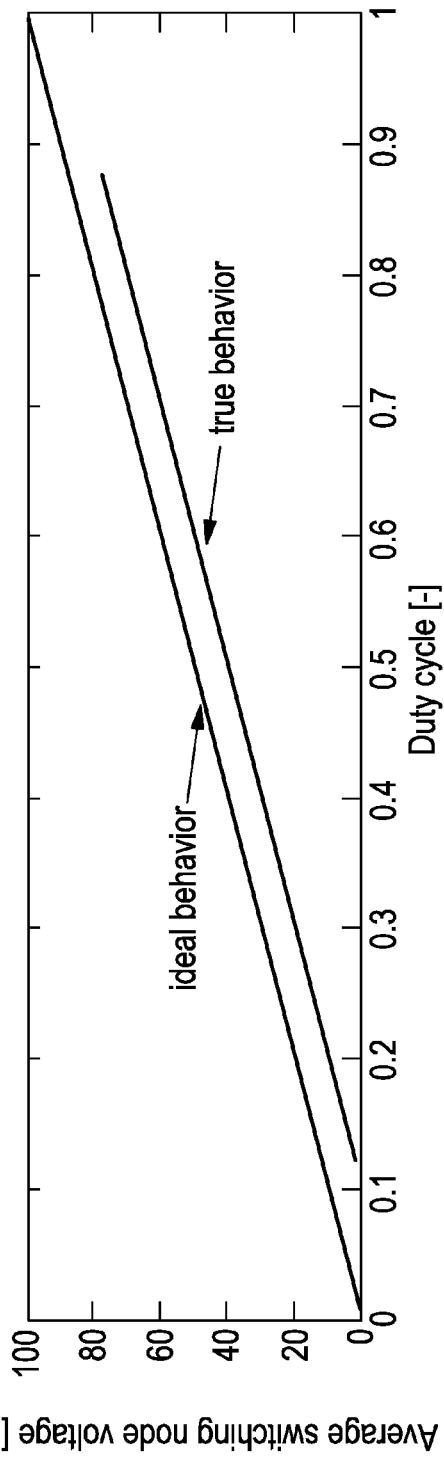
FIG. 4 shows the dependence of the average phase leg voltage on the duty cycle for a constant (5 A) current load.

The drop or boost of the average node voltage as shown in FIG. 3 can be compensated for by adjusting the duty cycle of the gate signals which drive the power semiconductors. The table values as shown in FIG. 3 can be used to change the timing of the switching events such that the average node voltage for the interval considered in this example (i.e. 20 µs) is corrected. The amount of (timing) correction needed can be found by evaluating the dependence of the average switching node voltage on the duty cycle. For the case of a constant-current load of 5 A, this has been depicted in FIG. 4.

Figure 4B:
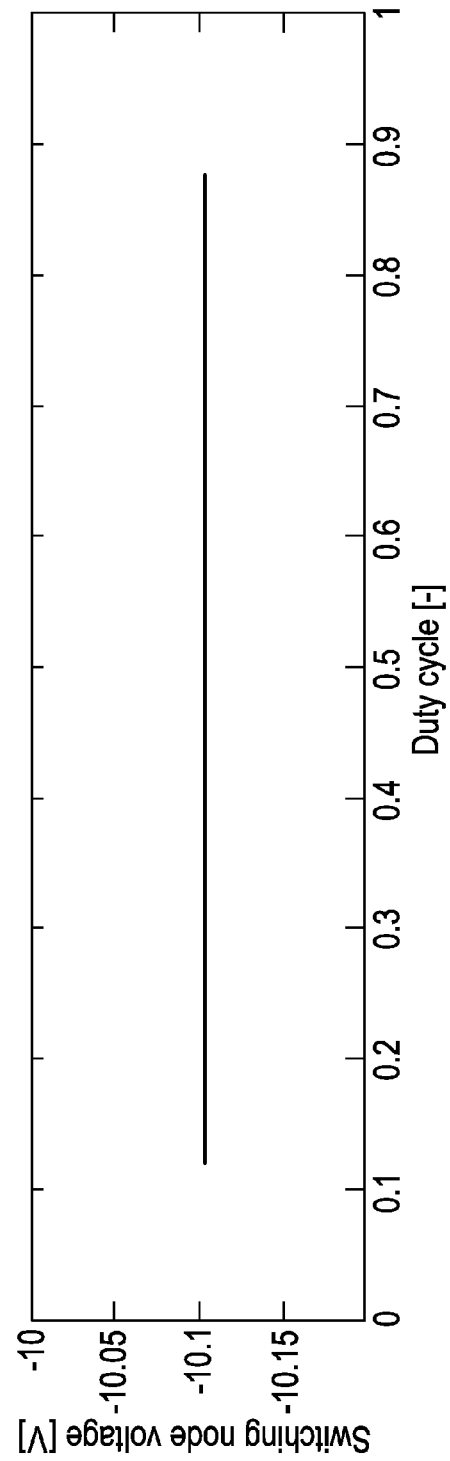

In this case the difference between true and ideal behavior, as shown in FIG. 4B, is independent of the duty cycle. It follows that the compensation can be found easily, as the plot for the true behavior (shown in FIG. 4A) is a straight line. For this case, the only measurement value necessary for the compensation is the output current.

Figure 5:
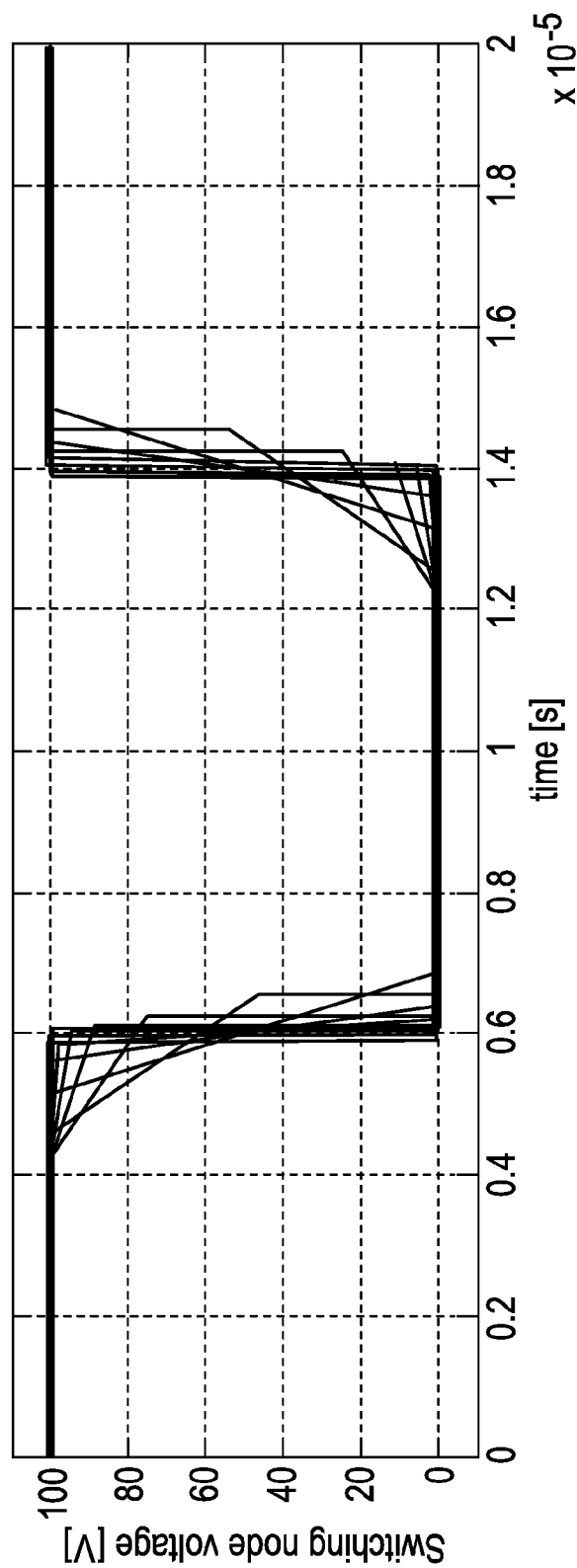
FIG. 5 shows the phase leg voltage with timing compensated for both edges.

The shape of the switching node voltage after applying the compensation is shown in FIG. 5. In the example of FIG. 5, not only the average phase leg voltage has been compensated for, but also the timing of the individual edges has been adjusted such that the centre of gravity of the complete voltage wave is re-centered to t=10 µs.

Another way of looking at such a compensation is that the first (time from 0 to 10 µs) and second (time from 10 µs to 20 µs) halves of the time interval have been treated individually. For the voltage edges which go all the way from 0 to 100V or reverse in a straight line, the traces in FIG. 5 clearly show that the point halfway the edge lies exactly at 50V in this example. For the edges which are composed of two segments the situation is more complicated, still the centre of gravity of these edges is also repositioned to the desired locations at t=6 µs and t=14 µs respectively.

Figure 6:
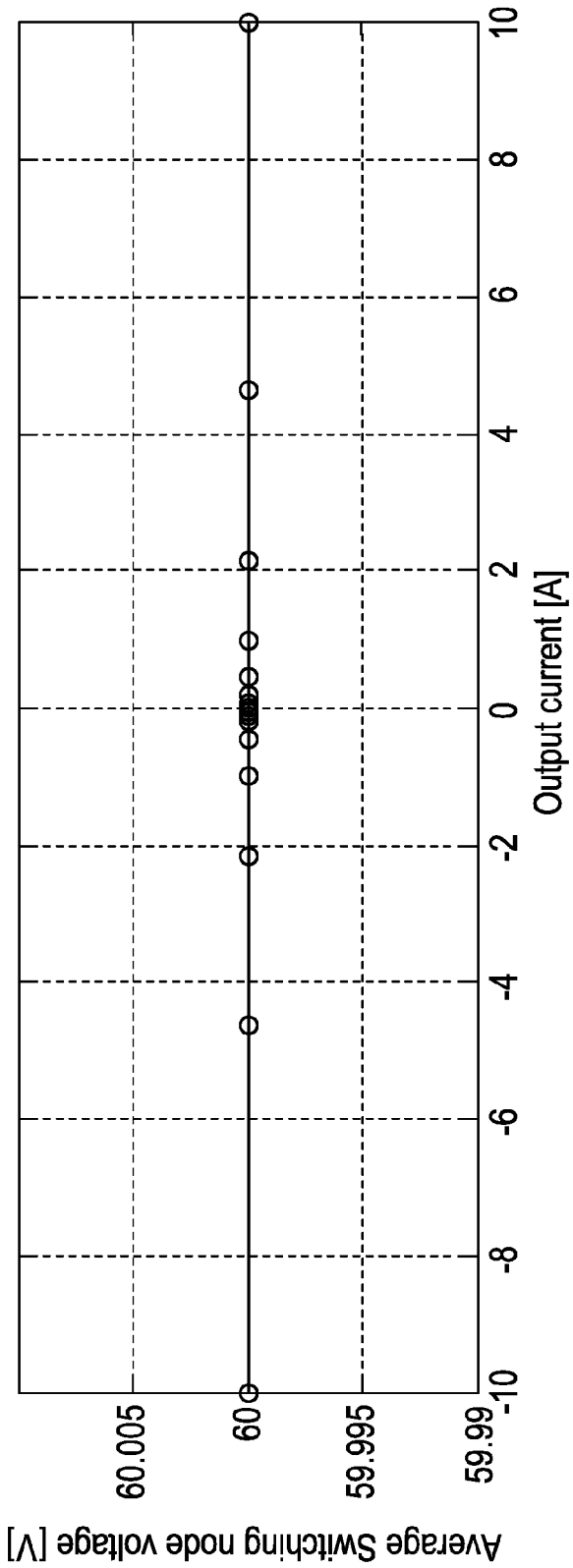
FIG. 6 shows the average phase leg voltage after applying the compensation.

For the cases shown here, the compensation can lead to almost perfect results, the set point value of 60 volts can be realized to within a few mV. The resulting average phase leg voltage is shown in FIG. 6.

Figure 7:
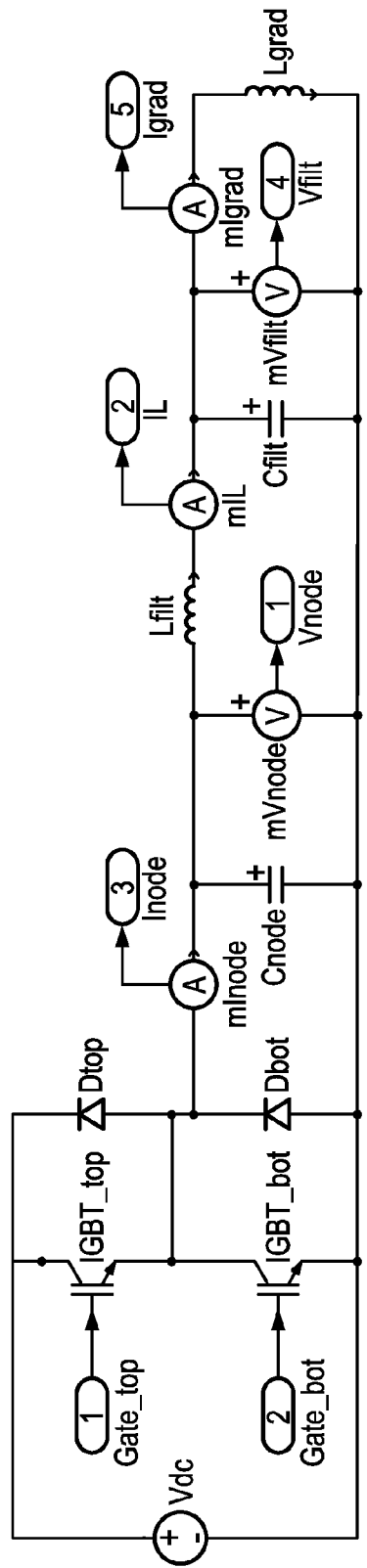
FIG. 7 shows a typical load circuit for an MRI gradient amplifier.

If a "real" load circuit is connected to the phase leg, the situation becomes more complicated because the output current now includes ripple and thus changes over time. A typical load circuit, as used in de gradient chain of an MRI scanner, is shown in FIG. 7.

The load circuit comprises a filter inductance Lfilt, filter capacitor Cfilt, and a gradient coil Lgrad. Typically, the filter inductance is approximately 5% of the gradient coil inductance. As in FIG. 1, measurement devices have been added to the circuit to indicate the origin of the signals to be shown in subsequent figures.

For the following examples, the circuit has been configured with the following exemplary parameters:

| Name  | Value   | Meaning                                 |
|-------|---------|-----------------------------------------|
| Vdc   | 100 [V] | DC supply voltage                       |
| I_Vf  | 1 [V]   | IGBT equivalent forward voltage drop    |
| I_Rf  | 10 [mΩ] | IGBT equivalent differential resistance |
| D_Vf  | 1 [V]   | Diode equivalent forward voltage drop   |
| D_Rf  | 10 [mΩ] | Diode equivalent differential resistance|
| Cnode | 2 [nF]  | Capacitance on switching node           |
| Lfilt | 25 [µH] | Filter inductance                       |

-continued

| Name  | Value    | Meaning                  |
|-------|----------|--------------------------|
| Cfilt | 10 [µF]  | Filter capacitance       |
| Lgrad | 500 [µH] | Gradient coil inductance |

For simplicity the losses (i.e. series resistance) in the filter and gradient inductors have been neglected in this approximate model, and these settings are not intended to reflect a usual operating point for an existing gradient amplifier.

Figure 8A:
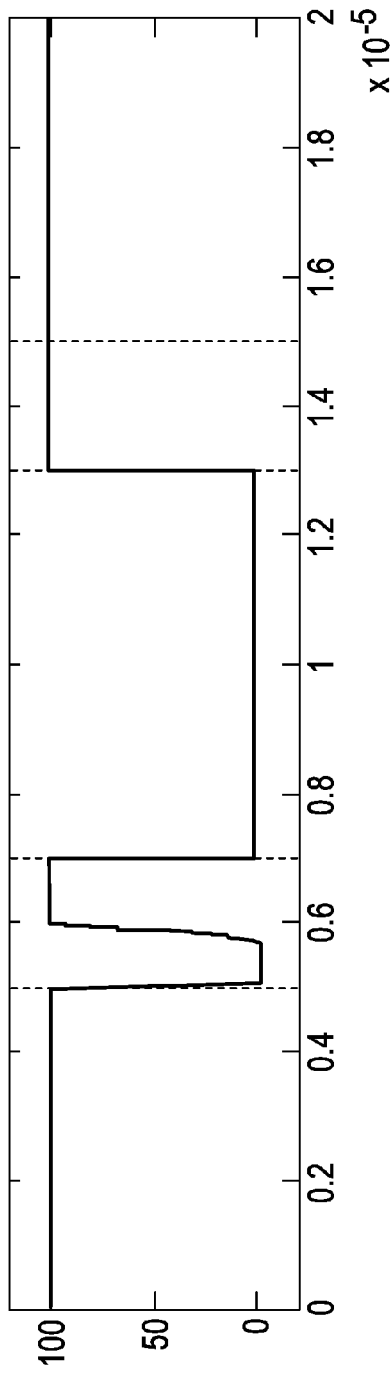
FIG. 8 shows an example of phase leg voltage and filter current with the load as shown in FIG. 7.
Figure 8B:
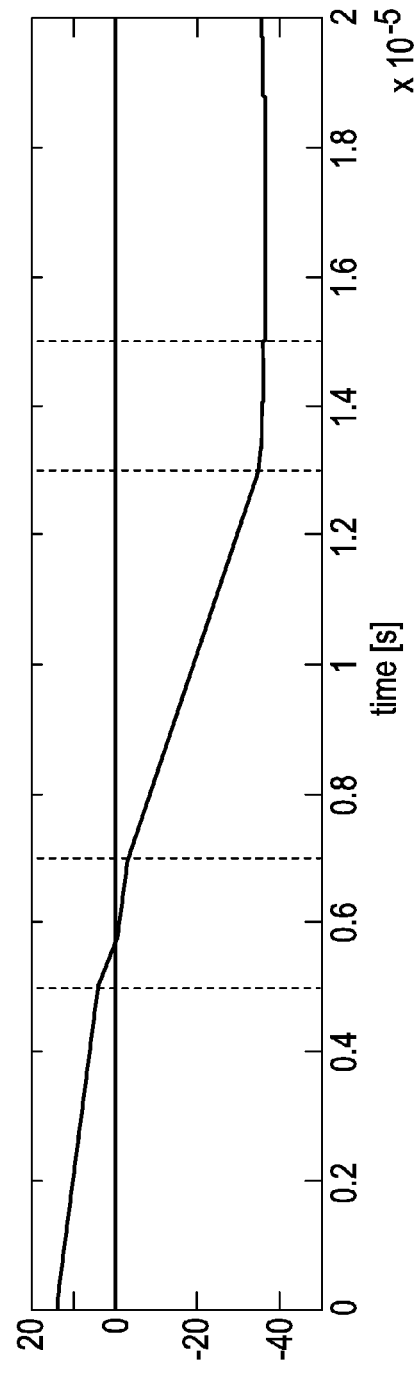

Especially when the filter current (mIL in FIG. 7) crosses through zero, the average switching node voltage produced during the next control cycle is difficult to predict analytically. An example of such a situation is shown in FIG. 8. Therein, the filter coil current depicted in FIG. 8B crosses through zero during the first dead-time interval. As a result, the node voltage depicted in FIG. 8A shows a glitch of significant width (ca. 1.1 µs).

The development of the switching node voltage over time depends on all initial values of the circuit states (Vnode, Ifilt, Vfilt, Igrad), the supply voltage, and the instants of switching of both power semiconductors, i.e. a number (e.g. seven) of parameters. In addition, the operating temperatures of several circuit elements (such as the four power semiconductors and the two inductors shown here in the embodiment) can come into play. Due to the resulting complexity of the circuit, an analytical solution of the network problem is not feasible. Still, to eliminate the non-linearities of the circuit, it is desirable to predict the average switching node voltage over the next interval of interest.

Such an adjustment is straightforward for the case with constant current load as described above related to FIG. 1. In that case, the average value of the switching node voltage shows linear dependence on the duty cycle, the slope being defined by the supply voltage V_sup, as shown in FIG. 4. The necessary correction of the duty cycle therefore equals the ratio of the simulated voltage drop or boost to the supply voltage, with the result as shown in FIG. 6.

In case of the more realistic load circuit, however, the compensation to use is not trivial to find, as—due to the more complicated signals as shown in FIG. 8—the average value of the switching node voltage no longer shows linear dependence on the duty cycle. In fact, this value depends on all circuit states and the switching instants in a complex manner. As an example, the average phase leg voltage for one particular initial situation (the same as used for FIG. 8) has been computed by means of simulation for a range of values for the duty cycle. The results are shown in FIG. 9, wherein FIG. 9A shows plots for the true and the ideal behavior of the average switching node voltage and FIG. 9B shows the difference between true and ideal behavior on an enlarged scale.

As before, the true behavior and the ideal behavior differ substantially here, but now in a nonlinear fashion. This makes it more complicated to correct the duty cycle such that the desired average voltage is produced.

Figure 10:
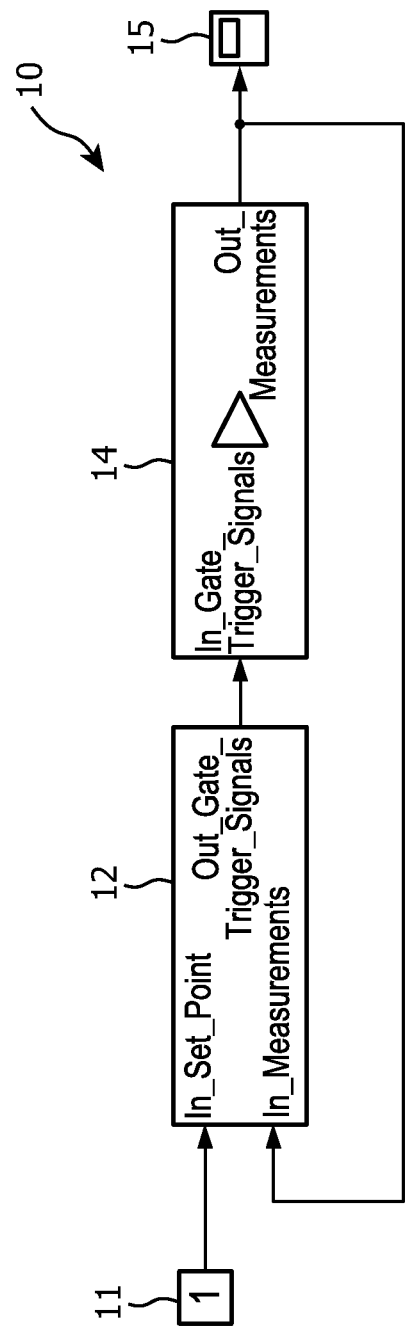
FIG. 10 shows a block diagram of a switched-mode power supply apparatus according to the present invention.

FIG. 10 shows a schematic a block diagram of the general layout of a switched-mode power supply apparatus 10. A controller 12 gets from an external signal source 11 as a system input a set point representing the desired output voltage or current and measurement signals measured at the output of a power amplifier 14, said measurement signals representing current(s) and/or voltage(s) that shall be reproduced similar to the set point. Which signals need to be measured depends on a variety of choices, such as the desired accuracy and the details of the power circuit. In the following it is assumed that circuit states associated with energy-storing circuit elements (i.e. capacitor voltages and inductor currents) are measured, but other choices are possible.

The controller 12 uses the information from the set point signal and the actual measurement signals to control the switching of power semiconductors provided in the amplifier 14. The power amplifier 14 comprises power circuitry and power semiconductors for generation of the desired output signal(s) based on the input control signals. The output signal(s) are generally a load voltage and/or a load current, which are provided to an external load 15.

Figure 11:
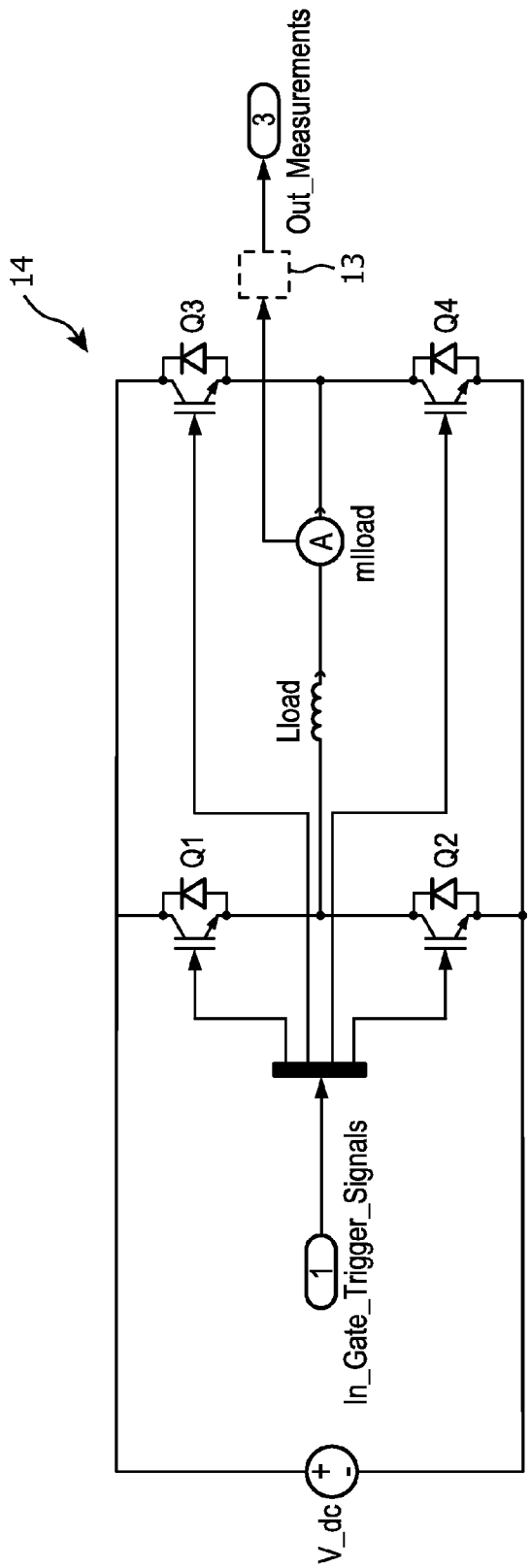
FIG. 11 shows an exemplary embodiment of a power amplifier.

An exemplary embodiment of the power amplifier 14 is depicted in FIG. 11. This circuit can be used as a current amplifier. The current through the load coil Lload is the controlled variable. In the following discussion this particular circuit will be used as an example for a power amplifier, but it should be noted that the present invention can be applied to other power amplifiers using different circuit configurations (topologies) as well.

Figure 12:
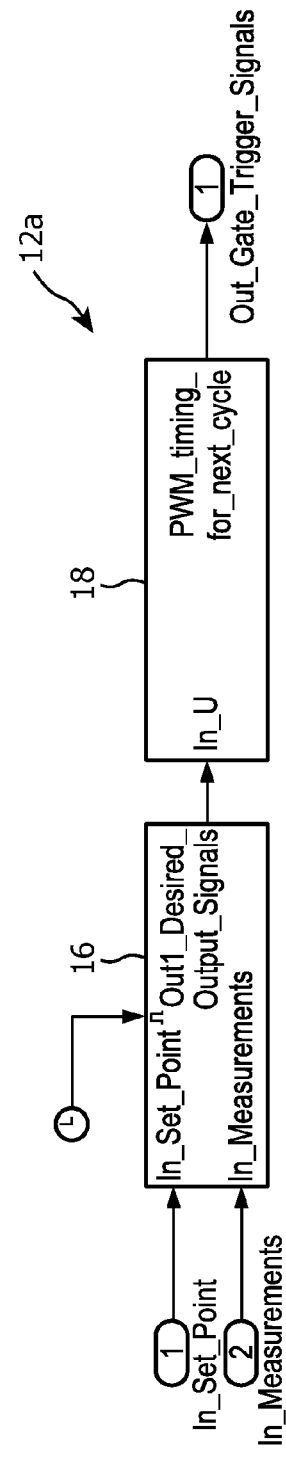
FIG. 12 shows a block diagram of a known embodiment of a control unit as conventionally used in a switched-mode power supply apparatus.

A known embodiment of the controller 12a is shown in FIG. 12. The controller 12a comprises a sampled control circuit 16 and a PWM modulator 18, which translates the desired voltage to timing signals. The sampled control circuit 16 uses a combination of the set point and measurement signals to periodically provide the desired average output voltage (for the next control cycle/time interval) of the amplifier 14. Inside the sampled control circuit usually a combination of feedforward and feedback control is used to obtain the desired result. Such a sampled control circuit is, for instance, described in "Control Systems Engineering" by Norman S. Nise, John Wiley & Sons, so that the details of it will not be explained here. An important feature here is that the control is sampled. Sampling implies that measurement data is obtained at certain instances, in most cases at a fixed frequency. Due to the sampling, measurement information "in between" the sampling instants is not available, and all actions (in this context decisions about switching events) are therefore necessarily based on "old" information.

The technique used by the modulator is generally known and, for instance, described in http://en.wikipedia.org/wiki/Pulse-width_modulation and "Pulse width modulation for power converters: principles and practice" by D. Grahame Holmes, Thomas A. Lipo, T. A. Lipo, Wiley-IEEE, 2003.

The present invention is directed to the function of the PWM modulator 18 shown in FIG. 12. As explained above, the average voltage produced by the amplifier 14 not only depends on the PWM timing, but also on the load condition, in particular the actual output current as illustrated in FIG. 3. For more complicated load circuits, the circuit behavior can deviate even more from the desired case, as shown in FIG. 9.

Figure 13:
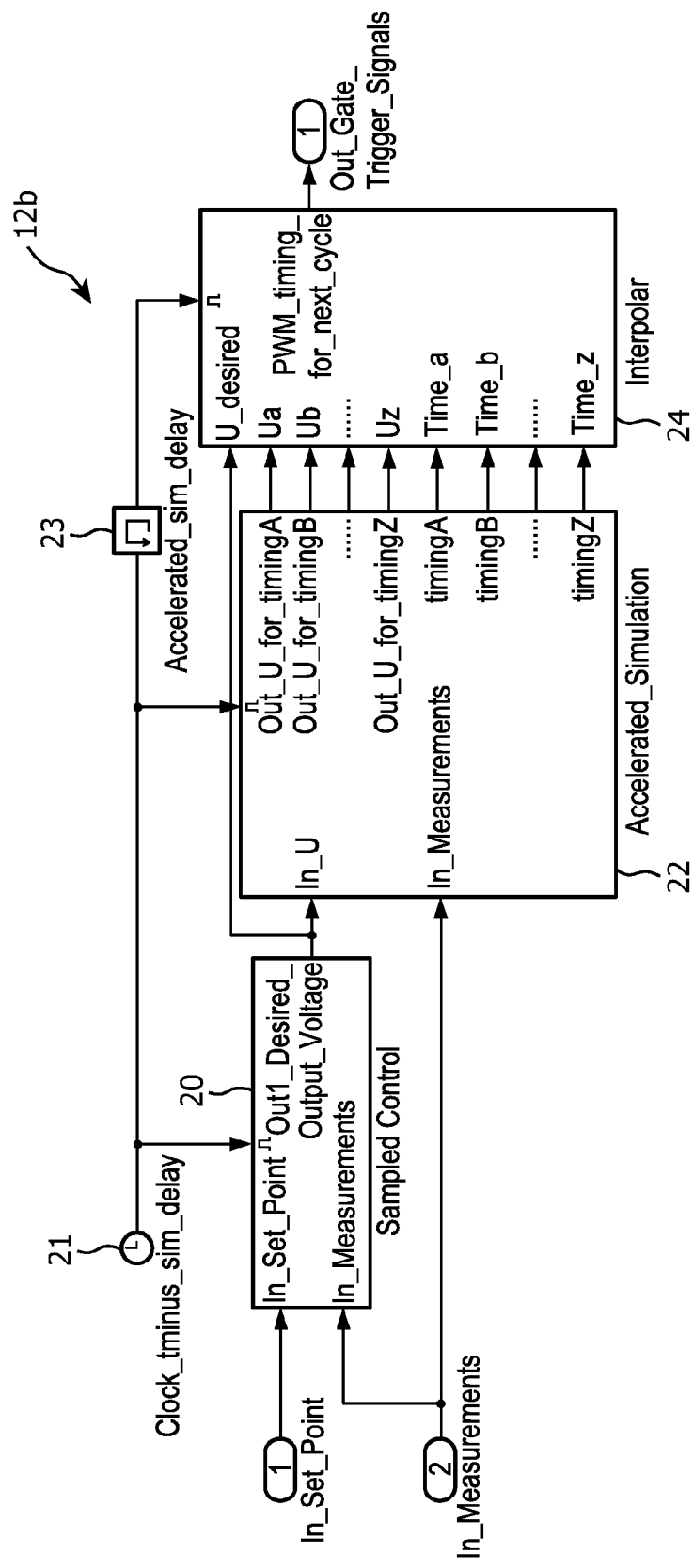
FIG. 13 shows a block diagram of an embodiment of a control unit according to the present invention for use in a switched-mode power supply apparatus as shown in FIG. 11.

In order to obtain a translation to PWM timing, which will reproduce the desired voltage with more reliability, the controller 12a, as shown in FIG. 12, is modified as shown in FIG. 13 showing an embodiment of a controller 12b according to the present invention, which can be used as controller 12 shown in the power supply apparatus 10 depicted in FIG. 10.

The sampled control circuit 20 is substantially identical to the sampled control circuit 16 of the controller 12a, but the PWM modulator 18 has been replaced by a simulation unit 22 and an interpolator 24. The operation of control circuit 12b is as follows.

Directly after the sampled control circuit 20 has finished the calculation of the desired output voltage, this value together with the measurements of all relevant power circuit signals (in most cases this will comprise complete or partial "state information", i.e. signals associated with energy-storing circuit elements, which is provided via the input "in_measurements") are used by the simulation unit 22 in an accelerated simulation ("accelerated" being used here to imply that the simulation result for a full control cycle is ready well before the control cycle has passed in real time) to predict the average output voltage of the power amplifier 14 for a variety of timing settings, schematically indicated with A, B, . . . , Z in FIG. 13. How many of these timing settings are really needed depends on the desired accuracy and details of the power amplifier. Input "in_U" of the simulation unit 22 can, optionally, be used to restrict the number of timing settings, for example using advance knowledge about the maximum deviation from the "ideal" PWM modulator briefly described above.

In the circuit diagram of FIG. 13 Clock_minus_sim_delay produces a trigger a time "accelerated_sim_delay" before the clock as defined in the earlier controller. So, the output of the latter is precisely the original clock. The "in_measurements" (i.e. the "state information") contains circuit signals (including supply voltage(s)), some of which can possibly be predicted instead of measured.

Preferably, the power amplifier 14 is fitted with optional sensors 13 (as schematically shown in FIG. 11) to provide all those circuit signals. Preferably, in a real design as little sensors as possible should be used, but what is possible there depends on the desired accuracy, the available computational resources, and the circuit details.

The average output voltage is predicted for a variety of timing settings. There are various possibilities where the timing settings come from. The most crude and resource-hungry approach would be to generate a fixed number of time settings (that would be internal in the "Accelerated_Simulation" unit 22) and compute the resulting voltages.

To save resources, it may also be possible in another embodiment to compute the voltages only for a smaller set of these time settings using advance knowledge for the desired voltage, Input In_U can be used for that purpose. What is possible again depends on the desired accuracy and circuit details. For example, for the original circuit (FIG. 1) it is very likely that two timing points would be sufficient as the dependence of voltage on timing is almost linear. For the circuit shown in FIG. 7, more time points will probably be needed, but still it would in this example be a waste to do the advanced simulation for time points around duty cycle=0.1 if it is known that an average voltage of 80V is needed. One would then for example only perform the accelerated simulation for some time points corresponding to duty cycle interval [0.6.0.8].

The output of the simulation unit 22 comprises a number of predicted output voltages, one value for each timing setting. In the interpolator 24 this information is used to obtain the optimal timing setting, which, when applied to the power amplifier 14, will generate the desired output voltage. This process is illustrated in FIG. 14.

Figure 14:
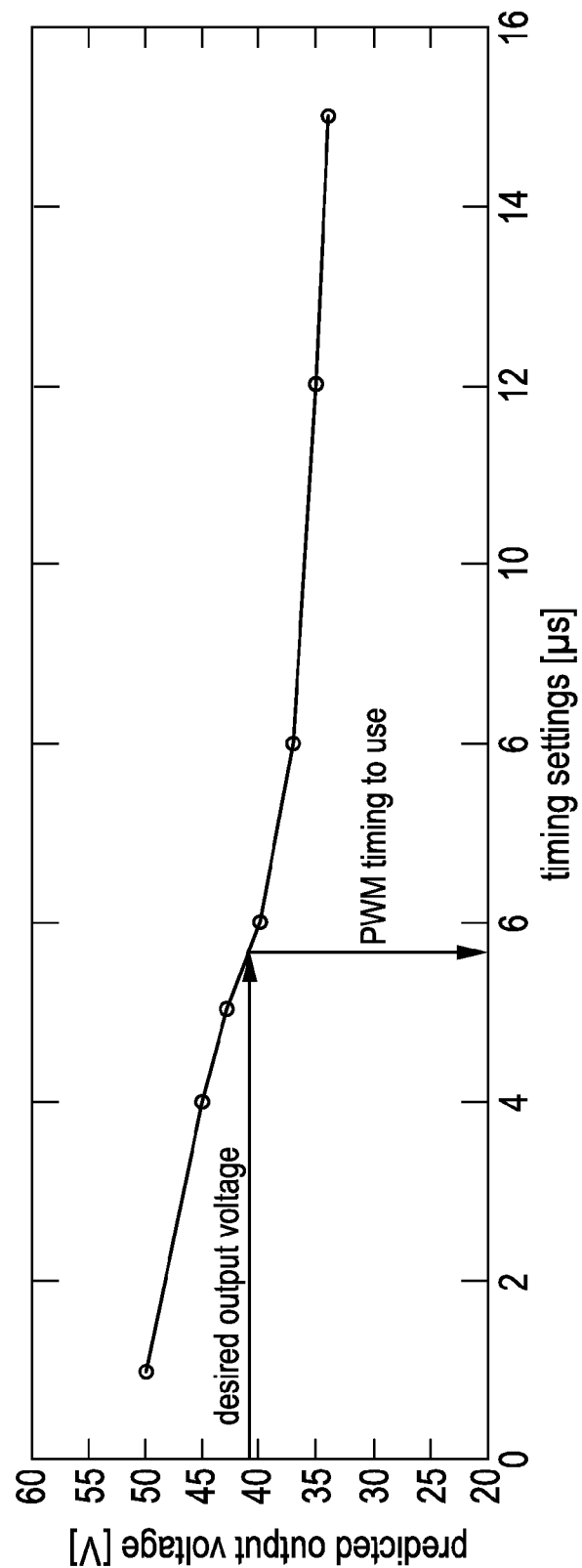
FIG. 14 shows a diagram illustrating the determination of the timing setting according to the present invention.

FIG. 14 shows a plot of the output of the simulation unit, in particular the predicted output voltage versus timing settings, in this case for timing settings of [1 4 5 6 8 12 15] μs. If, for example, an average voltage of 41V is commanded by the sampled control circuit 20, the corresponding optimal timing setting is found by interpolation, as shown by the arrows in FIG. 14. The result in this example would be t=5.67 μs.

This setting can now be applied to the gate trigger signals of the power amplifier 14, and it will, depending on the detail and accuracy of the simulation model and the timing points chosen in the graph shown in FIG. 14, reproduce the desired output voltage with high fidelity.

An embodiment of the present invention is thus a hardware circuit simulation on accelerated time scale. Using the latest information measured in the system, in particular at the output of the power amplifier, the circuit is simulated using a (circuit) model of the behavior. This model can be either analogue or digital, but in the following a digital (FPGA) version is considered as this is by far the most flexible solution with present-day technology.

The simulation model to be implemented comprises differential equations obtained by elementary circuit analysis, combined with details of the switching behavior. As an example, the differential equations for the circuit shown in FIG. 1 in the case both IGBTs are turned off would be something like d(Vnode)/dt=I_bridge/Cnode. If either of the IGBTs is turned on extra terms come into play due to the on-resistance of the IGBT concerned. These differential equations are then discretized using appropriate time step(s) and a discrete (difference equation) solver, which must be robust for the Eigen values (time constants) of interest in the circuit. This discretization process is generally known in the art, and has been described for example in "K. Watanabe, D. M. Himmelblau "Analysis of trajectory errors in integrating ordinary differential equations", Journal of the Franklin Institute, Volume 314, Issue 5, November 1982, Pages 283-321, ISSN 0016-0032.

As an example it will be assumed that the difference equations can be simulated with acceptable accuracy using time steps of 10 ns. If the difference equations describing the discretized behavior are now executed on a 1 ns clock, which appears to be well within reach of actual FPGA devices, a result 10 times (i.e. 10 ns/1 ns) faster than in real time can be obtained. In other words, when 10% of the cycle time (2 μs in the example above) has passed, an estimate of the average voltage produced by the phase leg over the complete cycle (20 μs) is achieved, which can still be corrected by adjusting one or more of the switching events in time.

The simulation in the example would execute in 2000 (2 μs/1 ns) steps. In a final implementation a variable time step is used for the simulation model in an embodiment. Simulations have shown that using an appropriate variable-step solver, a solution can be found already using ca. 1000 steps, so within 1 μs in the example.

The simulation provides the average switch node voltage for a certain setting of the duty cycle. To be able to compensate this voltage by means of the switch timing (i.e. the timing settings as described above), the sensitivity of this voltage to switch timing changes needs to be found. This sensitivity is the slope of the "true behavior" curves as shown in FIG. 4 and FIG. 9.

A possible approach is to run two or more simulation models in parallel, using perturbed values for the switch timing events. In an embodiment several identical models with different switch timings are used, each generating a single average voltage. These are then used in the interpolator 24 to retrieve the timing which should reproduce U_desired. The differences in outcome between the models are a direct indication of the sensitivity of the average switch node voltage to timing changes. This sensitivity can then be used for the voltage compensation. The number of such parallel models to run is limited in essence, as only small corrections to the timing are targeted.

Figure 15:
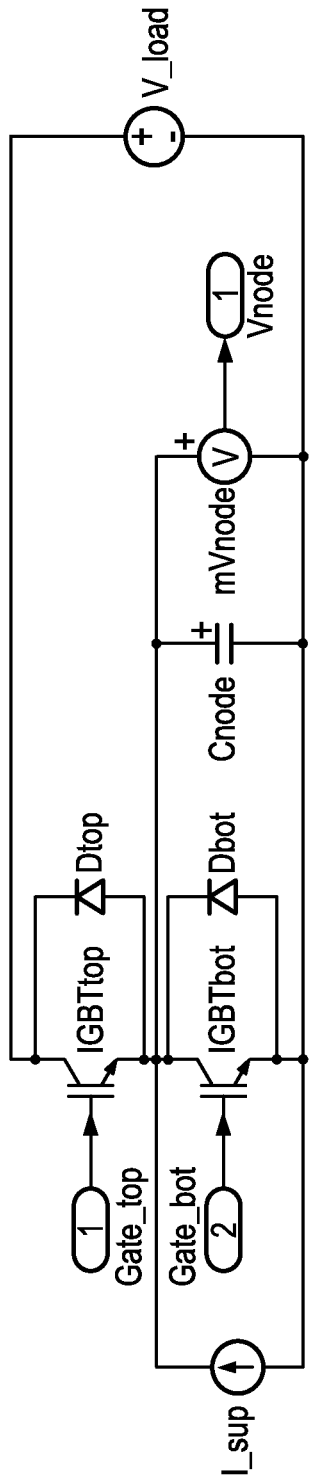
FIG. 15 shows a circuit diagram of an amplifier with current-source power supply, loaded by a circuit with voltage-source character.

The present invention has been illustrated above with examples originating in a voltage-fed, current-output amplifier such as often applied in drives using magnetic motors and applications involving a load coil. However, the approach proposed according to the present invention is also valid for power amplifiers supplied by a current source and with a capacitive load, which at the typical switching frequency behaves like a voltage source. A simplified embodiment of such an application is shown in FIG. 15, where the amplifier is supplied with power by a current source I_sup and the load circuit has been drawn as a voltage source V_load. As in the examples before, it is preferred to introduce a dead time interval between the switching of the two power switches IGBTtop and IGBTbot, giving rise to non-linearities in the current supplied to the load. The net impact of these non-linearities can again be computed by simulation of a circuit model on an accelerated time scale.

The present invention is preferably used in switching power amplifiers in applications where feed-forward is used in the current or voltage control loop. Examples are MRI gradient current amplifiers, motion control amplifiers such as presently used in ASML (PAAC, PADC) and Assembléon products, and audio amplifiers supplying capacitive loud speakers.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims.

In the claims, the word "comprising" does not exclude other elements or steps, and the indefinite article "a" or "an" does not exclude a plurality. A single element or other unit may fulfill the functions of several items recited in the claims. The mere fact that certain measures are recited in mutually different dependent claims does not indicate that a combination of these measures cannot be used to advantage.

Any reference signs in the claims should not be construed as limiting the scope.

The invention claimed is:

1. A switched-mode power supply apparatus comprising:
   a switching power amplifier for amplifying a signal supplied by an external signal source and for supplying a load voltage and/or load current to a load, and
   a control unit for controlling the switching of said switching power amplifier based on a timing setting, said control unit being adapted for simulating the behavior of the switching power amplifier by predicting the average load voltage and/or load current for at least two, in particular a plurality of, timing settings for a desired load voltage and/or load current based on state information about the present state of the switching power amplifier.

2. The switched-mode power supply apparatus as claimed in claim 1,
   wherein said control unit is adapted for selecting the timing settings for controlling the switching of said switching power amplifier from the timing settings used for predicting the average load voltage and/or load current by selecting the timing setting belonging to a predicted average load voltage and/or load current closest to the desired load voltage and/or load current.

3. The switched-mode power supply apparatus as claimed in claim 1,
   wherein said control unit is adapted for determining the timing setting for controlling the switching of said switching power amplifier by interpolating between the timing settings belonging to predicted average load voltages and/or load currents closest to the desired load voltage and(or load current.

4. The switched-mode power supply apparatus as claimed in claim 1,
   wherein said control unit comprises a sampled control circuit for determining the desired load voltage and/or load current from the state information about the present state of the switching power amplifier and a set point.

5. The switched-mode power supply apparatus as claimed in claim 1,
wherein said control unit is adapted for predicting the average supply voltage and/or supply current for a predetermined number of timing settings, in particular for a number in the range from 2 to 25 of timing settings.

6. The switched-mode power supply apparatus as claimed in claim 1,
further comprising sensing means for sensing said state information about the present state of the switching power amplifier, in particular for sensing internal currents and/or voltages of the switching power amplifier and/or the temperature of one or more elements of the power amplifier and/or the power supply apparatus.

7. The switched-mode power supply apparatus as claimed in claim 1,
wherein said control unit is adapted for predicting the average load voltage and/or load current for the next switching period.

8. The switched-mode power supply apparatus as claimed in claim 1,
wherein said control unit is adapted for predicting the average load voltage and/or load current for a subsequent time interval, in particular equal to a control cycle or in the range from 1 to 200, in particular from 5 to 50 μsec.

9. A device comprising a load to be provided with a load voltage and/or load current, said device comprising:
a load to be provided with a load voltage and/or load current, and
a switched-mode power supply apparatus as claimed in claim 1 for supplying a load voltage and/or load current to the load.

10. A switched-mode power supply method comprising the steps of:
amplifying a signal supplied by an external signal source and for supplying a voltage and/or current to a load by a switching power amplifier, and
controlling the switching of said switching power amplifier based on a timing setting by simulating the behavior of the switching power amplifier by predicting the average loadvoltage and/or load current for at least two, in particular a plurality of, timing settings for a desired load voltage and/or load current based on state information about the present state of the switching power amplifier.

\* \* \* \* \*